(12) United States Patent
Kaneguchi (10) Patent No.: US 11,515,349 B2
(45) Date of Patent: Nov. 29, 2022

(54) SEMICONDUCTOR UNIT (71) Applicant: SONY SEMICONDUCTOR SOLUTIONS CORPORATION, Kanagawa (JP)

(72) Inventor: Tokihisa Kaneguchi, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 180 days.

(21) Appl. No.: 16/964,654

(22) PCT Filed: Jan. 8, 2019

(86) PCT No.: PCT/JP2019/000217
§ 371 (c)(1),
(2) Date: Jul. 24, 2020

(87) PCT Pub. No.: WO2019/150888
PCT Pub. Date: Aug. 8, 2019

(65) Prior Publication Data
US 2021/0057476 A1    Feb. 25, 2021

(30) Foreign Application Priority Data
Feb. 1, 2018  (JP) .............................. JP2018-016513

(51) Int. Cl.
*H01L 27/146* (2006.01)
(52) U.S. Cl.
CPC .. *H01L 27/14632* (2013.01); *H01L 27/14618* (2013.01); *H01L 27/14636* (2013.01)

(58) Field of Classification Search
CPC ................... H01L 23/544; H01L 2223/54426
See application file for complete search history.

(56) References Cited

U.S. PATENT DOCUMENTS

| 5,358,807 A | 10/1994 | Okamoto |
| 8,674,524 B1 | 3/2014 | Woerz et al. |
| 2005/0161837 A1 | 7/2005 | Matsui |
| 2012/0056292 A1 | 3/2012 | Suzuki et al. |

FOREIGN PATENT DOCUMENTS

| JP | H03-119355 | 5/1991 |
| JP | H11-340112 | 12/1999 |
| JP | 2000-124107 | 4/2000 |
| JP | 2005-217071 | 8/2005 |
| JP | 2008-135671 | 6/2008 |
| JP | 2012-059832 | 3/2012 |

OTHER PUBLICATIONS

International Search Report and Written Opinion prepared by the Japanese Patent Office dated Mar. 25, 2019, for International Application No. PCT/JP2019/000217.

*Primary Examiner* — Changhyun Yi
(74) *Attorney, Agent, or Firm* — Sheridan Ross P.C.

(57) ABSTRACT

A semiconductor unit includes: a semiconductor substrate; a first groove provided in the semiconductor substrate, having a first width W1 and extending in a first direction; and a second groove provided in the semiconductor substrate in communication with the first groove, having a second width W2 different from the first width, and extending in a second direction that intersects the first direction, in which one of the first groove and the second groove is used for alignment.

18 Claims, 6 Drawing Sheets

FIG. 6

SEMICONDUCTOR UNIT

CROSS REFERENCE TO RELATED APPLICATIONS

This application is a national stage application under 35 U.S.C. 371 and claims the benefit of PCT Application No. PCT/JP2019/000217 having an international filing date of 8 Jan. 2019, which designated the United States, which PCT application claimed the benefit of Japanese Patent Application No. 2018-016513 filed 1 Feb. 2018, the entire disclosures of each of which are incorporated herein by reference.

TECHNICAL FIELD

The present disclosure relates to a semiconductor unit including a semiconductor substrate.

BACKGROUND ART

The development of semiconductor units such as a WCSP (Wafer level Chip Size Package) has recently progressed. The WCSP includes, for example, a functional device such as a light-receiving device between a semiconductor substrate and a sealing substrate (for example, refer to PTL 1).

A surface of the semiconductor substrate is provided with a through electrode, a rewiring layer, a solder ball, etc., for example. A process of forming the components on the semiconductor substrate includes forming an alignment groove in the semiconductor substrate to perform position adjustment, for example.

CITATION LIST

Patent Literature

PTL 1: Japanese Unexamined Patent Application Publication No. 2012-59832

SUMMARY OF THE INVENTION

Regarding such a semiconductor unit with an alignment move, it is desired to reduce occurrence of a failure due to the alignment groove.

Accordingly, it is desirable to provide a semiconductor unit that is able to reduce occurrence of a failure due to the alignment groove.

A semiconductor unit according to an embodiment of the present disclosure includes: a semiconductor substrate; a first groove provided in the semiconductor substrate, having a first width W1 and extending in a first direction; and a second groove provided in the semiconductor substrate in communication with the first groove, having a second width W2 different from the first width, and extending in a second direction that intersects the first direction, in which one of the first groove and the second groove is used for alignment.

The semiconductor unit according to the embodiment of the present disclosure is provided with the second groove in communication with the first groove, and therefore, even if an alignment groove (the first groove or the second groove) is closed in a production process, a substance in the alignment groove moves to the other groove.

Being provided with the second groove in communication with the first groove, the semiconductor unit according to the embodiment of the present disclosure makes it possible to reduce the occurrence of a failure resulting from a substance being trapped in the alignment groove, for example. Consequently, it is possible to reduce the occurrence of a failure due to the alignment groove.

It is to be noted that the above contents are an example of the present disclosure. The effects of the present disclosure are not limited to those described above and may be other different effects, or may further include any other effect.

MODES FOR CARRYING OUT THE INVENTION

In the following, an embodiment of the present disclosure is described in detail with reference to the drawings. It is to be noted that description is made in the foil owing order.

1. Embodiment (a semiconductor unit with an alignment groove and a discharge groove)
2. Application Example (an example with a WCSP)

Embodiment

Figure 1:
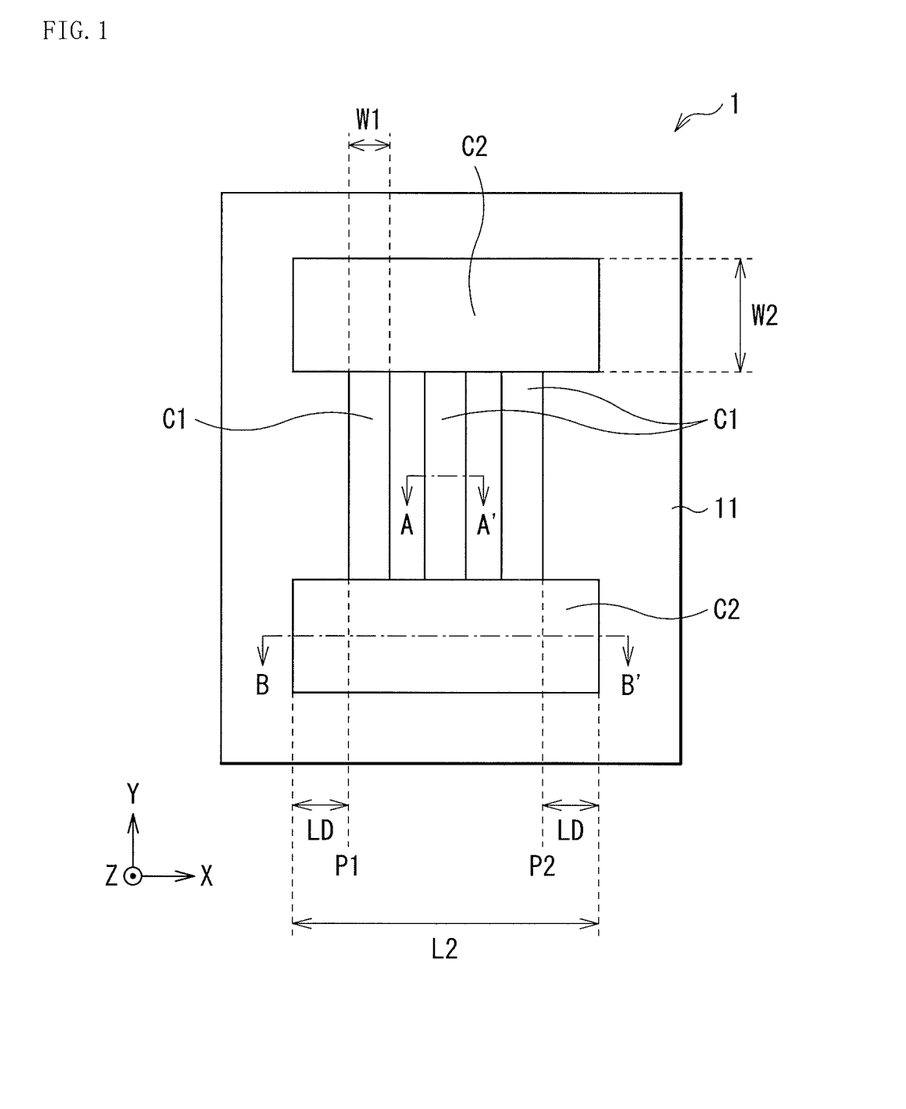
FIG. 1 is a planar schematic diagram illustrating a schematic configuration of a portion of a semiconductor unit according to an embodiment of the present disclosure.
Figure 2A:
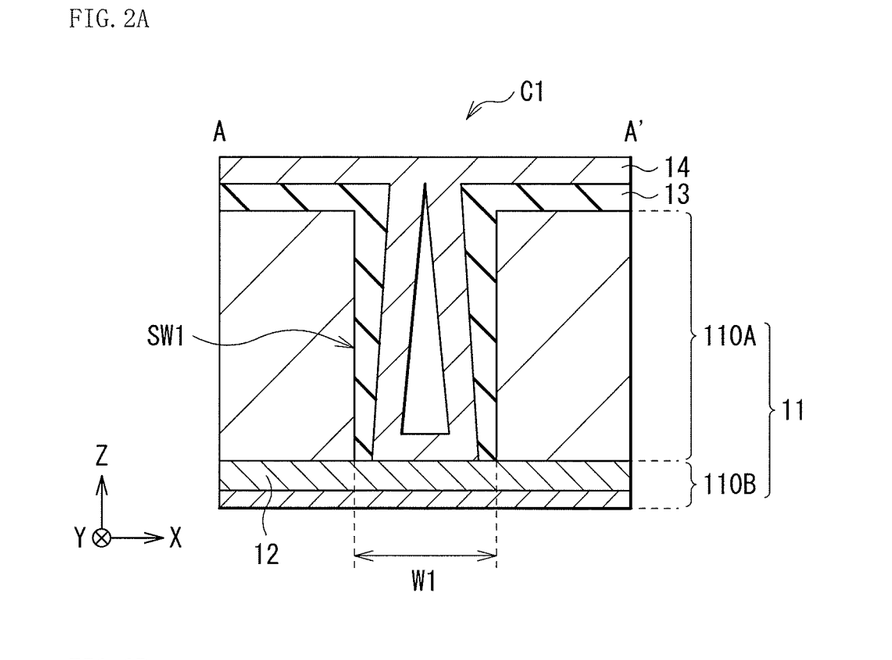
FIG. 2A is a schematic diagram illustrating a cross-sectional configuration along a line A-A' in FIG. 1.
Figure 2B:
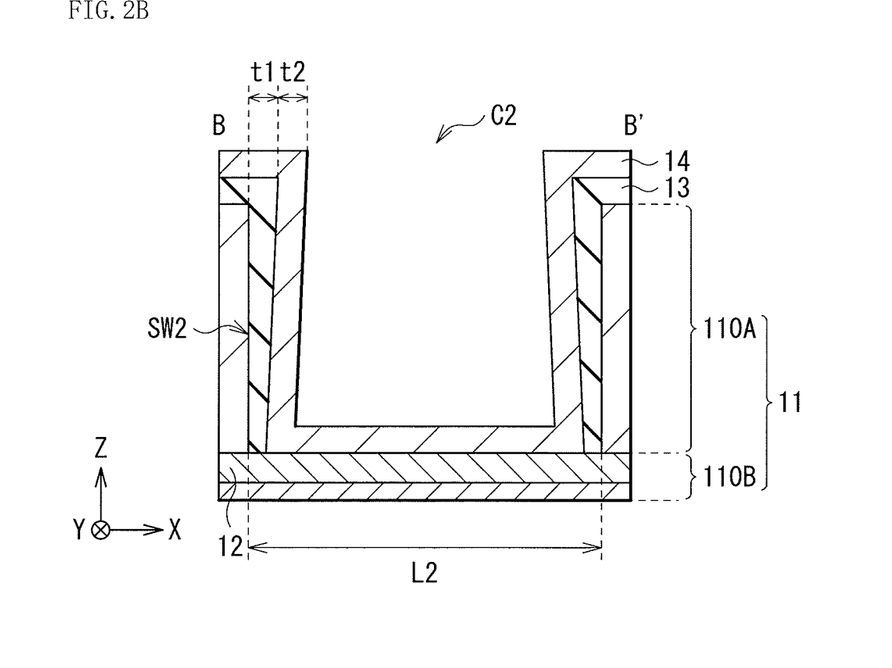
FIG. 2B is a schematic diagram illustrating a cross-sectional configuration along a line B-B' in FIG. 1.

FIG. 1 schematically illustrates a planar configuration of a portion of a semiconductor unit (semiconductor unit 1) according to an embodiment of the present disclosure. FIG. 2A illustrates a cross-sectional configuration along a line A-A' in FIG. 1, and FIG. 2B illustrates a cross-sectional configuration along a line B-B' in FIG. 1. This semiconductor unit 1 is applied to, for example, a WCSP (a wafer level package 10 in FIG. 6 described later) or the like. The semiconductor unit 1 includes a semiconductor substrate 11 provided with an alignment groove C1 and a discharge groove C2. The semiconductor unit 1 includes, for example, an insulating film 13 and a plating film 14 in this order on this semiconductor substrate 11 (FIG. 2A and FIG. 2B).

The semiconductor substrate 11 includes, for example, a semiconductor layer 110A and a wiring layer 110B, having a stacked structure thereof. The semiconductor layer 110A is, for example, a silicon (Si) layer. This semiconductor layer 110A is provided with the alignment groove C1 and the discharge groove C2. The wiring layer 110B includes an electrically-conductive film 12. The electrically-conductive film 12 includes a metal such as copper (Cu) or aluminum (Al), for example. The alignment groove C1 and the discharge groove C2 reach the electrically-conductive film 12, and the electrically-conductive film 12 constitutes a bottom surface of each of the alignment groove C1 and the discharge groove C2. It is to be noted that the alignment groove C1 is a specific example of a first groove according to the present technology and the discharge groove C2 is a specific example of a second groove according to the present technology.

The semiconductor substrate 11 is provided with a plurality of alignment grooves C1, for example. The alignment grooves C1 are marks used for alignment (positioning) in forming the plating film 14, for example. Upper sides of these alignment grooves C1 are closed by the plating film 14, for example. The plurality of alignment grooves C1 is arranged side by side at a predetermined interval in one direction (an X-direction in FIG. 1). Specifically, three alignment grooves C1 are arranged side by side in a region between from a position P1 to a position P2, the position P1 and the position P2 being at a distance from each other in the X-direction. These three alignment grooves C1 extend in the same direction (a Y-direction in FIG. 1, a first direction). Each of the alignment grooves C1 has a width W1 (a dimension in the X-direction in FIG. 1, a first width), for example. The width W1 of each of the alignment grooves C1 is in a range from several μm to several tens of μm, for example. The respective widths W1 of the plurality of alignment grooves C1 may be different from each other. Respective lengths (dimensions in the Y-direction in FIG. 1) of the plurality of alignment grooves C1 are substantially the same and positions (positions in the Y-direction in FIG. 1) of respective both ends of the plurality of alignment grooves C1 are in alignment with each other, for example.

In the present embodiment, the discharge groove C2 is provided, being coupled to respective ends of the plurality of alignment grooves C1, and the discharge groove C2 is in communication with the alignment grooves C1. This allows a plating solution (a plating solution 142 in FIG. 5 described later) in the alignment grooves C1 to move to the discharge groove C2 even if the alignment grooves C1 are closed by the plating film 14 or the like. An upper side of the discharge groove C2 is open, The discharge groove C2 is coupled to each of both ends of the alignment grooves C1, for example. Specifically, two discharge grooves C2 are provided for the three alignment grooves C1. One end of each of the three alignment grooves C1 is coupled to one of the discharge grooves C2, and the other end of each of the three alignment grooves C1 is coupled to the other discharge groove C2. The two discharge grooves C2 each have a width W2 (a dimension in the Y-direction in FIG. 1, a second width) different from the width W1 of each of the alignment grooves C1, and extend in a direction (the X-direction in FIG. 1, a second direction) that intersects an extending direction of the alignment grooves C1. For example, the extending direction of the alignment grooves C1 is orthogonal to an extending direction of the discharge grooves C1 The respective widths W2 of the two discharge grooves C2 may be different from each other. Respective lengths L2 (dimensions in the X-direction in FIG. 1) of the two discharge grooves C2 are substantially the same and positions (positions in the X-direction in FIG. 1) of respective both ends of the two discharge grooves C2 are in alignment with each other, for example.

The discharge grooves C2 are widened from each of the position P1 and the position P2, at which the alignment grooves C1 are arranged, by a distance LD. It is preferable that this distance LD satisfy an expression (1) below.

$$LD > t1 + t2 - W\tfrac{1}{2} \ldots \quad (1)$$

Here, t1 denotes a thickness of the insulating film 13 near a side wall SW2 of each of the discharge grooves C2, and t2 denotes a thickness of the plating film 14 near the side wall SW2 of each of the discharge grooves C2. The thicknesses t1 and t2 are maximum values considering variation in film formation. The thicknesses t1 and t2 and the width W1 are in units of μm, for example.

With the distance LD satisfying the expression (1), it is possible to prevent introduction portions of the discharge grooves C2 from the alignment grooves C1 provided at the positions P1 and P2 (joint portions of the discharge grooves C2 with the alignment grooves C1) from being closed by the insulating film 13 and the plating film 14.

The width W2 of each of the discharge grooves C2 is larger than the width W1 of each of the alignment grooves C1, and preferably satisfies an expression (2) below.

$$W2 > 2 \times t1 + 2 \times t2 \ldots \quad (2)$$

It is preferable that the length L2 of each of the discharge grooves C2 satisfy an expression (3) below while satisfying the above distance LD from each of the positions P1 and P2.

$$L2 > 2 \times t1 + 2 \times t2 \ldots \quad (3)$$

With the width W2 and the length L2 of each of the discharge grooves C2 respectively satisfying the above expressions (2) and (3), it is possible to prevent the discharge grooves C2 from being closed by the insulating film 13 and the plating film 14.

Figure 3:
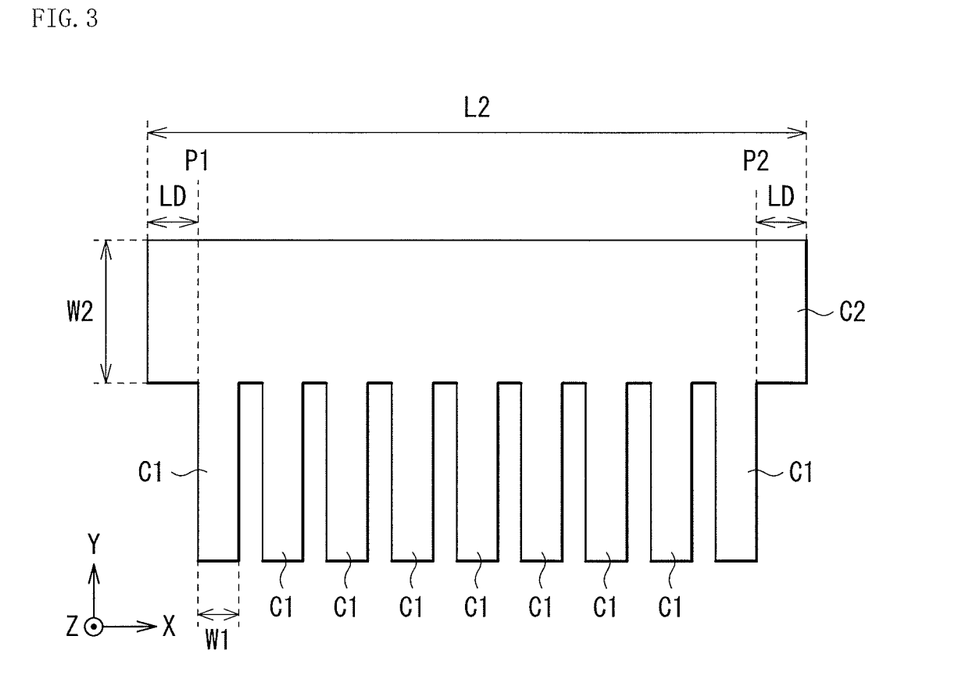
FIG. 3 is a plan schematic diagram illustrating another example of an alignment groove and a discharge groove illustrated in FIG. 1.

FIG. 3 illustrates another example of a configuration of the alignment groove C1 and the discharge groove C2. The number of the alignment grooves C1 may be four or more, or two, or may be one. It is sufficient that the discharge groove C2 is provided at least at one end of the alignment groove C1. For example, one end(s) of the alignment groove(s) C1 may be coupled to one discharge groove C2 while the other end(s) of the alignment groove(s) C1 may be closed. For example, the semiconductor unit 1 may include the alignment grooves C1 and the discharge grooves C2 illustrated in FIG. 1 and FIG. 3. It is possible that the alignment grooves C1 illustrated in FIG. 1 are used for search alignment while the alignment grooves C1 illustrated in FIG. 3 are used for fine alignment.

The insulating film 13 is provided on one surface of the semiconductor substrate 11, more specifically, on the semiconductor layer 110A, covering a side wall SW1 of the alignment groove C1 and the side wall SW2 of the discharge groove C2. The insulating film 13 is not provided on the bottom surface of each of the alignment groove C1 and the discharge groove C2. This insulating film 13 includes, for example, silicon oxide (SiO), silicon oxynitride (SiON), silicon nitride (SiN), or the like.

The plating film 14 is provided on the insulating film 13. In other words, the plating film 14 is provided on the one surface of the semiconductor substrate 11 with the insulating film 13 in between. This plating film 14 covers each of the side wall SW1 of the alignment groove C1 and the side wall SW2 of the discharge groove C2 with the insulating film 13 in between. The plating film 14 is also provided on the bottom surface of each of the alignment groove C1 and the discharge groove C2, being formed on the electrically-conductive film 12. This plating film 14 is formed by a plating method such as electroplating, for example. The plating film 14 includes, for example, a metal material such as copper (Cu), aluminum (Al), tungsten (W), titanium (Ti), gold (Au), nickel (Ni), silver (Ag), molybdenum (Mo), or a tungsten-titanium alloy (TiW). The plating film 14 closes the upper side of at least one of the alignment grooves C1.

Such a semiconductor unit 1 is produced as follows (FIG. 4A to FIG. 4C), for example.

Figure 4A:
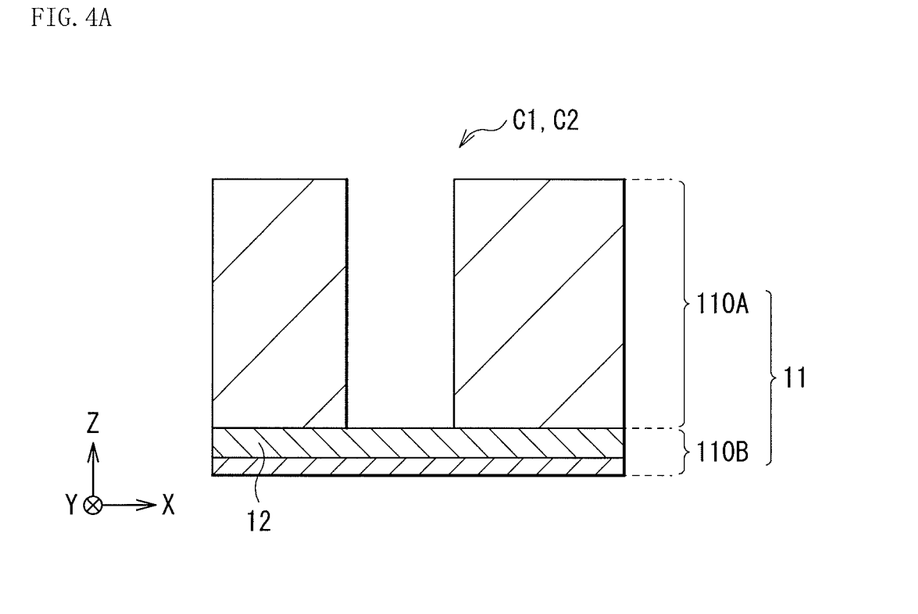
FIG. 4A is a cross-sectional schematic diagram illustrating a step of a production process of the semiconductor unit illustrated in FIG. 1, etc.

First, the semiconductor substrate 11 including the semiconductor layer 110A and the wiring layer 110B is prepared. Next, as illustrated in FIG. 4A, the alignment groove C1 and the discharge groove C2, each of which reaches the electrically-conductive film 12, are formed in the semiconductor layer 110A of this semiconductor substrate 11 by photolithography and dry etching.

Figure 4B:
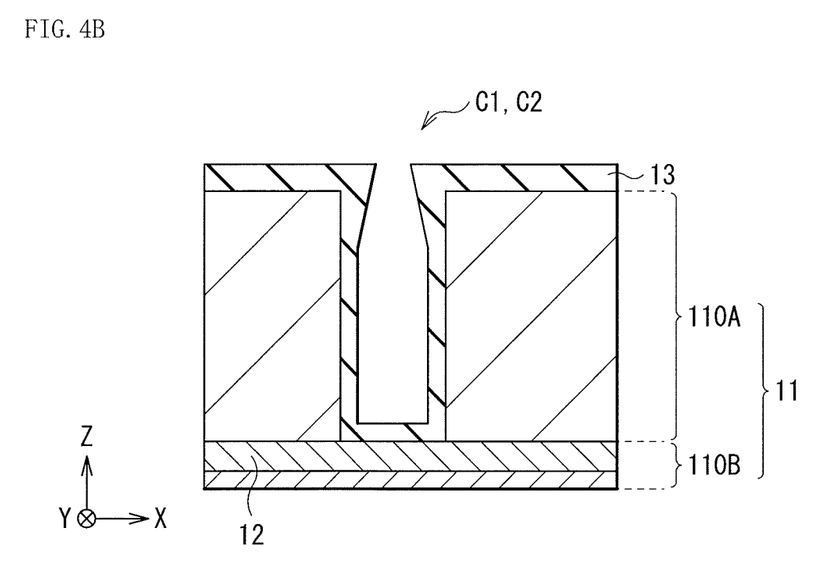
FIG. 4B is a cross-sectional schematic diagram illustrating a step subsequent to FIG. 4A.

Subsequently, as illustrated in FIG. 4B, the insulating film 13 including, for example, silicon oxynitride (SiON) is formed by CVD (Chemical Vapor Deposition) on an entire surface of the semiconductor layer 110A provided with the alignment groove C1 and the discharge groove C2. The insulating film 13 is thus formed on the side wall SW1 of the alignment groove C1 and the side wall SW2 of the discharge groove C2. The insulating film 13 formed on the bottom surface of each of the alignment groove C1 and the discharge groove C2 may be selectively removed.

Figure 4C:
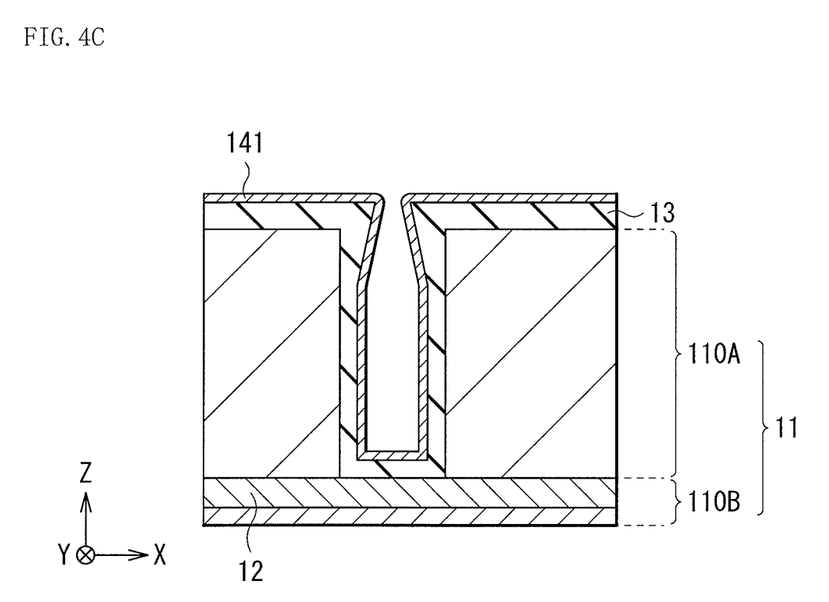
FIG. 4C is a cross-sectional schematic diagram illustrating a step subsequent to FIG. 4B.

After the formation of the insulating film 13, as illustrated in FIG. 4C, a seed layer 141 is formed on the entire surface of the semiconductor layer 110A by, for example, sputtering. The seed layer 141, which is provided for the formation of the plating film 14, includes copper (Cu), for example. After the formation of the seed layer 141, patterning of the seed layer 141 is performed by, for example, photolithography and etching. For this patterning of the seed layer 141, alignment of a photoresist film is performed with the alignment groove C1, for example. The plating film 14 is then formed by immersing the semiconductor substrate 11 provided with the seed layer 141 in a plating solution (the plating solution 142 in FIG. 5 described later) including, for example, copper sulfate ($CuSO_4$). For example, the alignment groove C1 having the small width W1 is closed by this plating film 14. An opening portion of the discharge groove C2 having the sufficient width W2 and length L2 remains. The semiconductor unit 1 illustrated in FIG. 1, etc. is completed through such a process.

The semiconductor substrate 11 of the semiconductor unit according to the present embodiment is provided with the discharge groove C2 in communication with the alignment groove C1, and therefore, even if the alignment groove C1 is closed in a production process, a substance in the alignment groove C1 moves to the discharge groove C2. This makes it possible to reduce occurrence of a failure resulting from the substance being trapped in the alignment groove C1. In the following, the workings and effects of the above are described.

Figure 5:
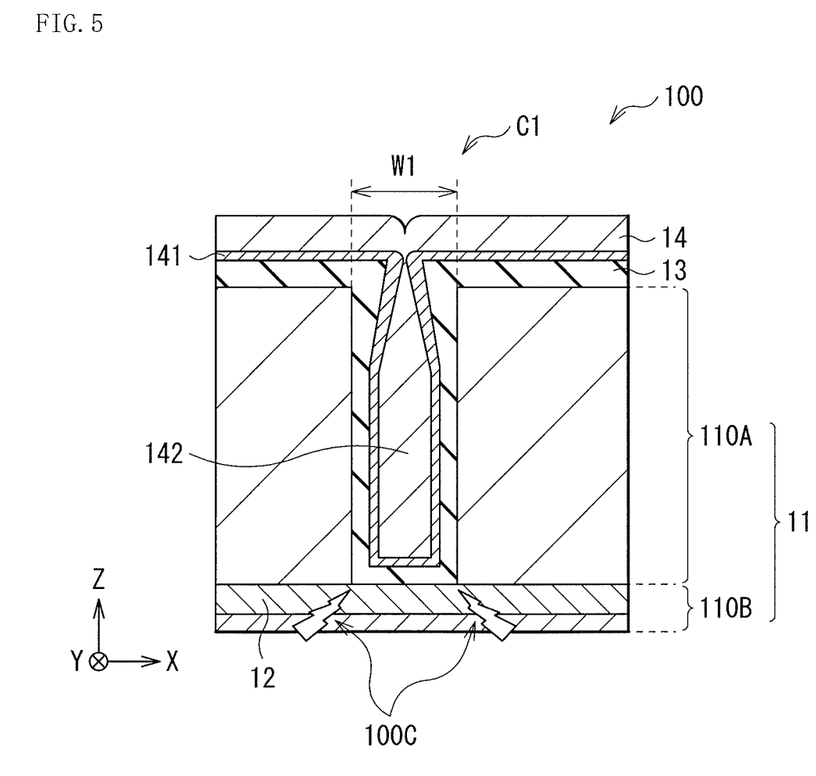
FIG. 5 is a cross-sectional schematic diagram illustrating a schematic configuration of a portion of a semiconductor unit according to a comparative example.

FIG. 5 illustrates a schematic cross-sectional configuration of a portion of a semiconductor unit (semiconductor unit 100) according to a comparative example. In this semiconductor unit 100, the semiconductor substrate 11 is provided with only the alignment groove C1. In other words, the semiconductor substrate 11 of the semiconductor unit 100 is not provided with any discharge groove (for example, the discharge groove C2 in FIG. 1). In a case of such a semiconductor unit 100, when forming the plating film 14, there is a possibility that the alignment groove C1 is closed by the plating film 14 while the plating solution 142 enters and remains in the alignment groove C1. That is, there is a possibility that the plating solution 142 is trapped in the alignment groove C1. This plating solution 142 in the alignment groove C1 becomes expanded during a heat treatment in the production process. The expanded plating solution 142 applies a local pressure to the semiconductor substrate 11 near the alignment groove C1, causing a crack (crack 1000) or the like to occur. The crack 1000 tends to occur near an interface between the semiconductor layer 110A and the wiring layer 110B, for example.

It is also likely that the alignment groove C1 is closed by, for example, the insulating film 13 or the like before the semiconductor substrate 11 is immersed in the plating solution 142. In this case, air is trapped in the alignment groove C1. There is a possibility that the trapped air in the alignment groove C1 causes a failure in the semiconductor unit 100.

Meanwhile, a method where the width W1 of the alignment groove C1 is sufficiently increased is conceivable. This method allows an opening of the alignment groove C1 to remain when the insulating film 13 and the plating film 14, etc. are formed. However, there is a possibility that an increase in the width W1 of the alignment groove C1 affects an alignment process, causing a failure in performing the alignment of the plating film 14, etc. with a sufficient accuracy, for example.

In contrast, in the present embodiment, the semiconductor substrate 11 is provided with the discharge groove C2 in communication with the alignment groove C1, and therefore, even if the alignment groove C1 is closed by the plating film 14 or the like, the plating solution (the plating solution 142 in FIG. 5) or air, etc. in the alignment groove C1 moves to the discharge groove C2. Accordingly, even when the semiconductor substrate 11 is subjected to heat treatment, the pressure is released through the discharge groove C2. This makes it possible to reduce the occurrence of a crack (the crack 100C in FIG. 5) or the like in the semiconductor substrate 11.

Further, because it is not necessary to increase the width W1 of the alignment groove C1, the occurrence of a crack or the like in the semiconductor substrate 11 is reduced without affecting the alignment process.

As described above, in the semiconductor unit 1 according to the present embodiment, the semiconductor substrate 11 is provided with the discharge groove C2 in communication with the alignment groove C1, which makes it possible to reduce the occurrence of a failure resulting from a substance (a plating solution or air, etc.) being trapped in the alignment groove C1. Therefore, it is possible to reduce the occurrence of a failure due to the alignment groove C1.

Application Example

Figure 6:
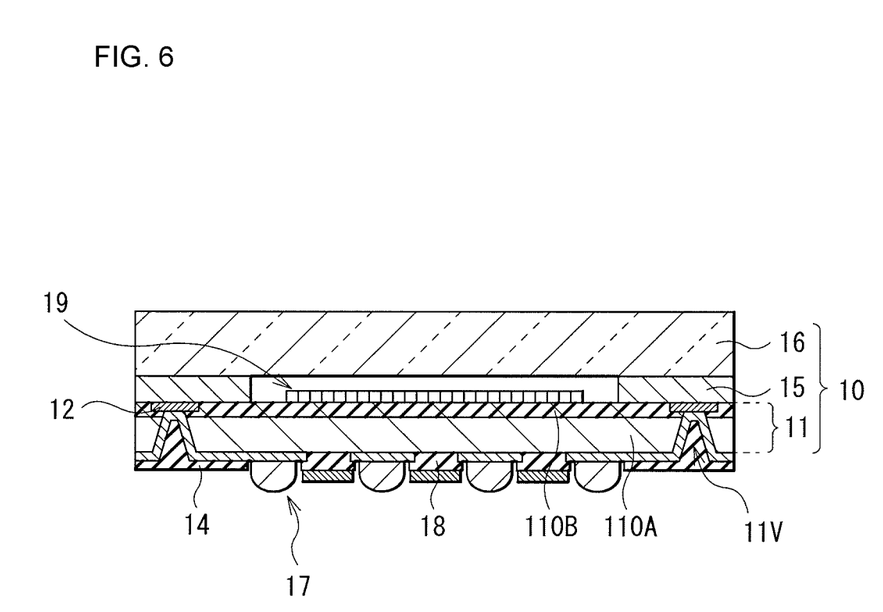
FIG. 6 is a cross-sectional schematic diagram illustrating an example of a configuration of a wafer level package in which the semiconductor unit illustrated in FIG. 1 is provided.

The semiconductor unit 1 according to the present embodiment is applied to, for example, a WCSP (the wafer level package 10 in FIG. 6 described hereafter).

FIG. 6 illustrates a schematic cross-sectional configuration of the wafer level package 10 to which the semiconductor unit it 1 is applied. This wafer level package 10 is a WCSP (wafer level chip size package) in which, for example, a light-receiving device 19 (functional device) is sealed between the semiconductor substrate 11 and a glass substrate 16 (sealing substrate). The semiconductor substrate 11 and the glass substrate 16 are bonded together at peripheral portions thereof via a bonding layer 15, and a region surrounded by these semiconductor substrate 11, glass substrate 16, and bonding layer 15 provides a cavity for hermetically sealing the light-receiving device 19. This wafer level package 10 is used for an optical apparatus such as an image sensor unit, for example. A semiconductor substrate 11 side of the wafer level package 10 is mounted on a printed board such as a mother board, and a glass substrate 16 side of the wafer level package 10 is bonded to a lens unit, for example.

The wiring layer 110B of the semiconductor substrate 11 is disposed on the glass substrate 16 side, and the semiconductor layer 110A of the semiconductor substrate 11 is opposed to the glass substrate 16 with the wiring layer 110B in between. That is, the alignment groove C1 and the discharge groove C2 (FIG. 2A and FIG. 2B) are provided in a surface of the semiconductor substrate 11 opposite to a surface thereof opposed to the glass substrate 16. The light-receiving device 19 is provided in contact with the wiring layer 110B, for example.

The electrically-conductive film 12 of the wiring layer 110B is disposed at the peripheral portion (a portion facing the bonding layer 15) of the semiconductor substrate 11, for example. This electrically-conductive film 12 is coupled to the light-receiving device 19 and a peripheral circuit thereof through a wiring line (not illustrated), for example. The electrically-conductive film 12 functions as an external connection pad for inputting an electric signal to the light-receiving device 19 or the peripheral circuit thereof, or extracting an electric signal outputted therefrom, for example.

The light-receiving device 19 is, for example, a solid-state image sensor such as a CCD (Charge Coupled Device) or a CMOS (Complementary Metal Oxide Semiconductor), and has a light-receiving surface provided with a color filter (not illustrated). The light-receiving device 19 performs exposure and reading of a light-receiving signal in response to an electric signal inputted through the electrically-conductive film 12, and externally outputs the read light-receiving signal through the electrically-conductive film 12.

A solder ball 17 and a sealing resin layer 18 are provided on the semiconductor layer 110A along with the plating film 14. The plating film 14 is provided in a selective region on the semiconductor layer 110A and the solder ball 17 is coupled to this plating film 14. The sealing resin layer 18 covers the plating film 14, while having an opening through which the plating film 14 is exposed. The solder ball 17 is provided in this opening of the sealing resin layer 18.

The semiconductor layer 110A is provided with a through via 11V at a position corresponding to the electrically-conductive film 12 of the wiring layer 110B. The through via 11V penetrates from a front surface to a rear surface of the semiconductor layer 110A, thereby exposing a portion of the electrically-conductive film 12. Inside the through via 11V, the plating film 14 is formed over a surface of the exposed electrically-conductive film 12, and extends (is drawn out) to a formation region for the solder ball 17 on the semiconductor layer 110A from the inside of the through via 11V. It is to be noted that the above-described insulating film 13 and seed layer 141 (FIG. 4C) are formed between the semiconductor layer 110A and the plating film 14. The through via 11V has a circular planar shape with a diameter of approximately 60 μm, for example. The alignment groove C1 and the discharge groove C2 are formed in the same process as a formation process of this through via 11V, for example.

The solder ball 17, which functions as an external connection terminal for mounting on the printed board, includes a lead-free high melting point solder or the like, such as Sn—Ag—Cu, for example. A plurality of solder balls 17 is regularly arranged on the semiconductor layer 110A at a predetermined pitch, for example. The arrangement of these solder balls 17 is determined as appropriate in accordance with a position of a bonding pad on a side of the printed board (not illustrated) intended for mounting thereon. This converts an arrangement of the electrically-conductive film 12 into the arrangement of the solder balls 17, allowing for direct mounting on the printed board such as a mother board. It is to be noted that although the solder balls 17 are arranged not to be formed near a middle of the semiconductor substrate 11 in FIG. 6, the solder balls 17 may be, of course, provided near the middle or provided only in a peripheral region. These solder balls 17 are electrically coupled to the electrically-conductive film 12 via the plating film 14.

The plating film 14 provided in the through via 11V is intended to electrically couple the solder balls 17 to the electrically-conductive film 12, and functions as a rewiring line.

The sealing resin layer 18 is provided for protecting the plating film 14, and has openings corresponding to the solder balls 17. This sealing resin layer 18 includes, for example, an epoxy-based, a polyimide-based, a silicon-based, or an acrylic-based resin or the like.

In this wafer level package 10, the electrically-conductive film 12 of the wiring layer 110B and the solder balls 17 on the semiconductor layer 110A are electrically coupled to each other via the through via 11V and the plating film 14. The external connection terminal is thereby drawn out from one surface (a surface on a wiring layer 110B side) of the semiconductor substrate 11 to another surface (semiconductor layer 110A) side thereof (the external connection terminal is converted from the electrically-conductive film 12 into the solder balls 17).

With the semiconductor substrate 11 of the wafer level package 10 provided with the discharge groove C2 in communication with the alignment groove C1, it is possible to reduce the occurrence of a failure due to the alignment groove C1. This enables improvement in yield of the wafer level package 10.

In the foregoing, the description has been made with reference to the embodiment and the application example; however, the contents of the present disclosure are not limited to the above embodiment, etc. but may be modified in a variety of ways. For example, the configuration of the semiconductor unit described in the above embodiment is an example and may further include another layer. In addition, the materials and thicknesses of the layers are also examples and are not limited to those described above.

For example, while a case of forming the plating film 14 on the semiconductor substrate 11 has been described in the above embodiment, a method other than a plating method may be used to form the film. Examples of the method other than a plating method include a CVD method, a physical vapor deposition (PVD: Physical Vapor Deposition) method, an atomic layer deposition (ALD: Atomic Layer Deposition) method, a sputtering method, etc.

Moreover, a case where the alignment groove C1 is used for the alignment of the plating film 14 has been described in the above embodiment; however, the alignment groove C1 may be used for the alignment of any other film.

Moreover, FIG. 2A illustrates an example in which the alignment groove C1 is closed by the plating film 14; however, the alignment groove C1 may be closed by any other film such as the insulating film 13, or the opening thereof may remain.

Moreover, FIG. 1 and FIG. 3 each illustrate an example where the plurality of alignment grooves C1 is arranged side by side in the same direction; however, the plurality of alignment grooves C1 may be arranged in mutually intersecting directions. Further, in the above embodiment, the description has been given with the alignment groove C1 and the discharge groove C2 taken as an example; however, the alignment groove C1 and the discharge groove C2 may not have a groove shape as long as they are in a form that makes it possible to achieve the effects of the present disclosure.

Moreover, a case where the light-receiving device 19 is used as the functional device has been described in the above application example; however, a functional device other than a light-receiving device may be used. For example, a MEMS (Micro Electro Mechanical System) may be used.

The effects described in the above embodiment, etc. are examples, and the effects of the present disclosure may be other than those described above or may further include any other effect.

It is to be noted that the present disclosure may have the following configurations.

(1)
A semiconductor unit including:
a semiconductor substrate;
a first groove provided in the semiconductor substrate, having a first width W1 and extending in a first direction; and
a second groove provided in the semiconductor substrate in communication with the first groove, having a second width W2 different from the first width, and extending in a second direction that intersects the first direction, in which
one of the first groove and the second groove is used for alignment.

(2)
The semiconductor unit according to (1), in which the second width W2 is larger than the first width W1.

(3)
The semiconductor unit according to (1) or (2), in which
the first groove is used for the alignment, and
the second groove is used for discharge of a substance that enters the first groove.

(4)
The semiconductor unit according to (3), in which
a plurality of the first grooves is arranged at a predetermined interval in a region from a first position to a second position, the first position and the second position being at a distance from each other in the second direction, and
the second groove is provided at least at one ends of the plurality of first grooves.

(5)
The semiconductor unit according to (4), in which the second groove is provided at each of both ends of the plurality of first grooves.

(6)
The semiconductor unit according to (4) or (5), further including:
an insulating film provided on a side wall of the first groove and a side wall of the second groove and having a thickness t1; and
a plating film stacked on the insulating film and having a thickness t2.

(7)
The semiconductor unit according to (6), in which
the second groove is widened from each of the first position and the second position by a distance LD, and
the distance LD satisfies an expression (1) below, $$LD > t1 + t2 - W1/2 \quad \ldots \quad (1).$$

(8)
The semiconductor unit according to (6) or (7), in which the second width W2 of the second groove satisfies an expression (2) below, $$W2 > 2 \times t1 + 2 \times t2 \quad \ldots \quad (2)$$

(9)
The semiconductor unit according to any one of (6) to (8), in which the second groove is open.

(10)
The semiconductor unit according to any one of (6) to (9), in which the first groove is closed by the insulating film or the plating film.

(11)
The semiconductor unit according to any one of (1) to (10), further including an electrically-conductive film provided on a bottom of each of the first groove and the second groove.

(12)
The semiconductor unit according to any one of (1) to (11), in which the semiconductor substrate includes a silicon layer.

(13)
The semiconductor unit according to any one of (1) to (12), further including:
a sealing substrate opposed to the semiconductor substrate; and
a functional device provided between the sealing substrate and the semiconductor substrate, in which
the first groove and the second groove are provided in a surface of the semiconductor substrate opposite to a surface thereof opposed to the sealing substrate.

(14)
The semiconductor unit according to any one of (1) to (13), in which the first direction and the second direction are orthogonal to each other.

This application claims the benefit of Japanese Priority Patent Application JP2018-16513 filed with the Japan Patent Office on Feb. 1, 2018, the entire contents of which are incorporated herein by reference.

It should be understood by those skilled in the art that various modifications, combinations, sub-combinations and alterations may occur depending on design requirements and other factors insofar as they are within the scope of the appended claims or the equivalents thereof.

What is claimed is:
1. A semiconductor Unit, comprising:
a semiconductor substrate;
a plurality ref first grooves provided in the semiconductor substrate, wherein each of the first grooves has a first width W1, wherein each of the first grooves extends in a first direction, and wherein the first grooves are arranged at a predetermined interval in a region from a first position to a second position, the first position and the second position being at a distance from each other in a second direction;
a second groove provided in the semiconductor substrate, wherein the second groove is provided at least at one end of each of the first grooves, wherein the second groove has a second width W2 that is larger than the first width W1, wherein the second groove extends in a second direction that intersects the first direction,
wherein the first grooves are used for alignment, and
wherein the second groove is used for discharge of a substance that enters the first grooves;
an insulating film provided on a side wall of each of the first grooves and on a side wall of the second groove, wherein the insulating film has a thickness t1; and
a plating film stacked on the insulating film and having a thickness t2.

2. The semiconductor unit according to claim 1, wherein the second groove is widened from each of the first position and the second position by a distance LD, and the distance LD satisfies an expression (1) below, $$LD > t1 + t2 - W\tfrac{1}{2} \ldots \quad (1).$$

3. The semiconductor unit according to claim 1, wherein the second width W2 of the second groove satisfies an expression (2) below, $$W2 > 2 \times t1 + 2 \times t2 \ldots \quad (2).$$

4. The semiconductor unit according to claim 1, wherein the second groove is open.

5. The semiconductor unit according to claim 1, wherein the first grooves are closed by the insulating film or the plating film.

6. A semiconductor unit, comprising:
a semiconductor substrate;
first groove provided in the semiconductor substrate, wherein the first groove has a first width W1, and wherein the first groove extends in a first direction;
a second groove provided in the semiconductor substrate, wherein the second groove is in communication with the first groove, wherein the second groove has a second width W2 that is different from the first width, wherein the second groove extends in a second direction that intersects the first direction, and wherein one of the first groove and the second groove is used for alignment; and
an electrically-conductive film provided on a bottom of each of the first groove and the second groove.

7. The semiconductor unit according to claim 6, wherein the second width W2 is larger than the first width W1.

8. The semiconductor unit according to claim 6, wherein the first groove is used for the alignment, and
wherein the second groove is used for discharge of a substance that enters the first groove.

9. The semiconductor unit according to claim 6, further comprising:
a plurality of the first grooves, wherein the first grooves are arranged at a predetermined interval in a region from a first position to a second position, the first position and the second position being at a distance from each other in the second direction, and
wherein the second groove is provided at least at one end of each of the first grooves.

10. The semiconductor unit according to claim 9, further comprising:
a plurality of second grooves, wherein a first one of the second grooves is provided at a first end of each of the first grooves, and wherein a second one of the second grooves is provided at a second end of each of the first grooves.

11. The semiconductor unit according to claim 9, further comprising:
an insulating film provided on a side wall of each of the first grooves and on a side wall of the second groove, wherein the insulating film has a thickness t1; and
a plating film stacked on the insulating film and having a thickness t2.

12. The semiconductor unit according to claim 11, wherein
the second groove is widened from each of the first position and the second position by a distance LD, and the distance LD satisfies an expression (1) below, $$LD > t1 + t2 - W\tfrac{1}{2} \ldots \quad (1).$$

13. The semiconductor unit according to claim 11, wherein the second width W2 of the second groove satisfies an expression (2) below, $$W2 > 2 \times t1 + 2 \times t2 \ldots \quad (2).$$

14. The semiconductor unit according to claim 11, wherein the second groove is open.

15. The semiconductor unit according to claim 11, wherein the first grooves are closed by the insulating film or the plating film.

16. The semiconductor unit according to claim 6, wherein the semiconductor substrate includes a silicon layer.

17. The semiconductor unit according to claim 6, wherein the first direction and the second direction are orthogonal to each other.

18. A semiconductor unit, comprising:
a semiconductor substrate;
a first groove provided in the semiconductor substrate, wherein the first groove has a first width W1, and wherein the first groove extends in a first direction;
a second groove provided in the semiconductor substrate, wherein the second groove is in communication with the first groove, wherein the second groove has a second width W2 that is different from the first width, wherein the second groove extends in a second direction that intersects the first direction, and wherein one of the first groove and the second groove is used for alignment;
a sealing substrate opposed to the semiconductor substrate; and
a functional device provided between the sealing substrate and the semiconductor substrate, wherein
the first groove and the second groove are provided in a surface of the semiconductor substrate opposite to a surface thereof opposed to the sealing substrate.

* * * * *